(12) United States Patent
Yi

(10) Patent No.: US 10,541,386 B2
(45) Date of Patent: Jan. 21, 2020

(54) EVAPORATION DEPOSITION EQUIPMENT AND EVAPORATION DEPOSITION METHOD

(71) Applicant: Wuhan China Star Optoelectronics Semiconductor Display Technology Co., Ltd., Wuhan, Hubei (CN)

(72) Inventor: Guoxia Yi, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/771,355

(22) PCT Filed: Feb. 28, 2018

(86) PCT No.: PCT/CN2018/077576
§ 371 (c)(1),
(2) Date: Jun. 1, 2018

(87) PCT Pub. No.: WO2019/148570
PCT Pub. Date: Aug. 8, 2019

(65) Prior Publication Data
US 2019/0237708 A1      Aug. 1, 2019

(30) Foreign Application Priority Data

Jan. 30, 2018 (CN) .......................... 2018 1 0092008

(51) Int. Cl.
*H01L 21/00*      (2006.01)
*H01L 51/56*      (2006.01)
(Continued)

(52) U.S. Cl.
CPC ............ *H01L 51/56* (2013.01); *C23C 14/042* (2013.01); *C23C 14/12* (2013.01); *C23C 14/243* (2013.01);
(Continued)

(58) Field of Classification Search
CPC ... H01L 51/56; H01L 51/001; H01L 51/0011; H01L 51/0012; C23C 14/042; C23C 14/12; C23C 14/243; C23C 14/50
See application file for complete search history.

(56) References Cited

U.S. PATENT DOCUMENTS

2011/0146579 A1* 6/2011 Seo ...................... C23C 14/243
                                                        118/726

FOREIGN PATENT DOCUMENTS

CN        102583237      7/2012
CN        102646614      8/2012
(Continued)

*Primary Examiner* — Richard A Booth
(74) *Attorney, Agent, or Firm* — Leong C. Lei

(57) ABSTRACT

The invention provides an evaporation deposition equipment and method, applicable to vapor-depositing an organic light-emitting layer on an array substrate with a formed anode layer, the evaporation deposition equipment comprising: a first platform, disposed with an electrode plate; a second platform, disposed above the first platform, for carrying the array substrate; a vaporizing unit, disposed at the electrode plate, for generating charged vapor-depositing material particles and spraying the charged vapor-depositing material particles towards the array substrate; a mask carrier, for fixing a mask with opening pattern between the array substrate and the vaporizing unit; an electric field forming unit, electrically connected to the array substrate and the electrode plate, for forming an electric field between the anode layer and the electrode plate, the electric field guiding the charged vapor-depositing material particles towards the
(Continued)

array substrate to deposit to form an organic light-emitting layer corresponding to the opening pattern.

12 Claims, 2 Drawing Sheets

(51) Int. Cl.
*H01L 51/00* (2006.01)
*C23C 14/04* (2006.01)
*C23C 14/24* (2006.01)
*C23C 14/50* (2006.01)
*C23C 14/12* (2006.01)
*C23C 14/32* (2006.01)
*H01L 51/50* (2006.01)
*H01L 27/32* (2006.01)

(52) U.S. Cl.
CPC .............. *C23C 14/32* (2013.01); *C23C 14/50* (2013.01); *H01L 51/001* (2013.01); *H01L 51/0011* (2013.01); *H01L 51/0012* (2013.01); *H01L 27/3211* (2013.01); *H01L 51/5012* (2013.01); *H01L 2251/558* (2013.01)

(56) References Cited

FOREIGN PATENT DOCUMENTS

| | | |
|---|---|---|
| CN | 103305794 | 9/2013 |
| CN | 104313538 A | 1/2015 |
| CN | 106816553 | 6/2017 |
| JP | 2013-41686 | 2/2013 |

\* cited by examiner

EVAPORATION DEPOSITION EQUIPMENT AND EVAPORATION DEPOSITION METHOD

RELATED APPLICATIONS

The present application is a National Phase of International Application Number PCT/CN2018/077576, filed Feb. 28, 2018, and claims the priority of China Application No. 201810092008.3, filed Jan. 30, 2018.

BACKGROUND OF THE INVENTION

1. Field of the Invention

The present invention relates to the field of organic light-emitting display techniques, and in particular to an evaporation deposition equipment and method for depositing an organic light-emitting layer on an array substrate.

2. The Related Arts

Organic light-emitting diodes (OLED) display panels, with the advantages of self-luminous, thin, wide viewing angle, and fast response, are considered a representative of new generation of flat display technologies and are increasingly appreciated by the industry.

The OLED display panels are the focus of current research. In the prior art, the basic structure of the OLED display panel comprises an anode layer, an organic light-emitting layer, and a cathode layer, wherein there are many film-forming methods for the organic light-emitting layer, such as, evaporation deposition film-forming method, molecular beam epitaxy method, organic chemical vapor deposition method, and so on. Since the evaporation deposition film-forming method has the advantages of simplicity, easy control of film thickness, and small pollution to the thin film, the prior art generally uses an evaporation deposition film-forming method to form an organic light-emitting layer, i.e., the vapor deposition material is heated in a vacuum environment to be evaporated and deposited onto a target substrate (array substrate) to form an organic light-emitting layer.

For the entire OLED panel to display a full-color image, each pixel unit in the panel must be able to display different colors. Currently, the OLEDs mainly use red, green, and blue light-emitting layers to respectively form red sub-pixel, green sub-pixel and blue sub-pixel. The light-emitting layers of sub-pixels of different colors must be evaporated and deposited sequentially because the materials used are different, the target deposition areas are different, and the patterns are different. During the evaporation deposition film-forming process, the fine metal masks (FMM) are used evaporation deposition of one color at a time to lay the red, green, and blue organic light-emitting materials side by side in each pixel unit on the OLED panel.

In the evaporation deposition process, there is no specific directionality in the diffusion of the deposition material particles generated by vaporization source to the target substrate, and in the sequential evaporation deposition of organic light-emitting materials of the red, green, and blue, colors, the evaporation material particles may still be deposited outside the target areas due to the gap between the masks and the target substrate although the masks are provided for blockage, which causes the color mixing problem on the OLED panel.

SUMMARY OF THE INVENTION

To overcome the aforementioned disadvantages, the object of the present invention is to provide an evaporation deposition equipment and evaporation deposition method for vapor-depositing organic light-emitting layers on an array substrate, able to prevent the deposition material particles from being deposited outside a target area and reduce the color mixing problem on the OLED panel.

To achieve the above object, the present invention provides an evaporation deposition equipment, applicable to vapor-depositing an organic light-emitting layer on an array substrate with a formed anode layer, the evaporation deposition equipment comprising:

a first platform, disposed with an electrode plate;

a second platform, disposed above the first platform, for carrying the array substrate;

a vaporizing unit, disposed at the electrode plate, for generating charged vapor-depositing material particles and spraying the charged vapor-depositing material particles towards the array substrate;

a mask carrier, for fixing a mask with opening pattern between the array substrate and the vaporizing unit;

an electric field forming unit, electrically connected to the array substrate and the electrode plate, for forming an electric field between the anode layer and the electrode plate, the electric field guiding the charged vapor-depositing material particles towards the array substrate to deposit to form an organic light-emitting layer corresponding to the opening pattern of the mask.

According to a preferred embodiment of the present invention, the vaporizing unit comprises a crucible and a nozzle, the nozzle is open toward the second platform; and the crucible is used for heating a vapor-depositing material to vaporize the vapor-depositing material to form vapor-depositing material particles, and the vapor-depositing material particles are ejected from the nozzle and rubbed against the nozzle to form the charged vapor-depositing material particles.

According to a preferred embodiment of the present invention, the nozzle has an opening width of 5-15 mm, and the vapor-depositing material particles have a particle size of 0.1-1 nm.

According to a preferred embodiment of the present invention, the electric field forming unit applies a first voltage to the anode layer through the array substrate, and the electric field forming unit applies a second voltage to the electrode plate; and the first voltage and the second voltage are not equal so that an electric field is formed between the anode layer and the electrode plate.

According to a preferred embodiment of the present invention, the electric field forming unit controls magnitude relationship between the first voltage and the second voltage according to charged polarity of the charged vapor-depositing material particles to adjust direction of the electric field; wherein, when the charged vapor-depositing material particles has a positive polarity, the electric field forming unit controls the second voltage to be greater than the first voltage; when the charged vapor-depositing material particles has a negative polarity, the electric field forming unit controls the second voltage to be less than the first voltage.

According to a preferred embodiment of the present invention, the array substrate is disposed with a pixel circuit and a signal input end, the anode layer is electrically connected to the pixel circuit, the electric field forming unit is electrically connected to the signal input end through a probe; and then applies the first voltage to the anode layer through the pixel circuit.

According to a preferred embodiment of the present invention, the evaporation deposition equipment further comprises a film thickness monitor unit that obtains a film thickness of the organic light-emitting layer by detecting a deposition rate of the charged vapor-depositing material particles.

The present invention also provides an evaporation deposition method, for vapor-depositing an organic light-emitting layer on an array substrate with a formed anode layer, the evaporation deposition method comprising:

S10: providing the aforementioned evaporation deposition equipment;

S20: fixing the array substrate to the second platform;

S30: fixing the mask with opening pattern to the mask carrier, disposed between the array substrate and the vaporizing unit;

S40: controlling the vaporizing unit to generate charged vapor-depositing material particles and spray the charged vapor-depositing material particles towards the array substrate;

S50: controlling the electric field forming unit to form an electric field between the anode layer and the electrode plate, the electric field guiding the charged vapor-depositing material particles towards the array substrate to deposit to form an organic light-emitting layer corresponding to the opening pattern of the mask.

According to a preferred embodiment of the present invention, the organic light-emitting layer comprises: a red organic light-emitting layer disposed on a first anode layer, a green organic light-emitting layer disposed on a second anode layer, and a blue organic light-emitting layer disposed on a third anode layer; wherein:

when depositing the red organic light-emitting layer, the opening pattern of the mask faces the first anode layer, and the electric field unit forms the electric field only between the first anode layer and the electrode plate;

when depositing the green organic light-emitting layer, the opening pattern of the mask faces the second anode layer, and the electric field unit forms the electric field only between the second anode layer and the electrode plate;

when depositing the blue organic light-emitting layer, the opening pattern of the mask faces the third anode layer, and the electric field unit forms the electric field only between the third anode layer and the electrode plate.

According to a preferred embodiment of the present invention, the evaporation deposition method further comprises: obtaining a film thickness of the organic light-emitting layer in real-time by detecting a deposition rate of the charged vapor-depositing material particles.

In the evaporation deposition equipment and the evaporation deposition method provided by the embodiments of the present invention, when an organic light-emitting layer is vapor-deposited on an array substrate, an evaporation unit generates charged vapor-depositing material particles to be sprayed toward a target array substrate, and then an applied electric field directs the charged vapor-depositing material particles to the array substrate. Whereby the charged vapor-depositing material particles are deposited in a predetermined target area along a direction perpendicular to the array substrate after passing through the opening pattern of the mask, which can not only prevent the charged vapor-depositing material particles from being deposited outside the target area and reduce the color mixing problem on the OLED panel, but also reduce the loss of the vapor-depositing material particles due to non-directional diffusion deposition and improve the utilization rate of the vapor-depositing material to reduce the cost.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To enable those skilled in the art to better understand the technical solutions in the present invention, the technical solutions in the embodiments of the present invention are clearly and completely described in the following with reference to the accompanying drawings in the embodiments of the present invention. Apparently, the described embodiments are only a part but not all of the embodiments of the present invention. All other embodiments obtained by a person of ordinary skill in the art based on the embodiments of the present invention without creative efforts shall fall within the protection scope of the present invention.

Figure 1:
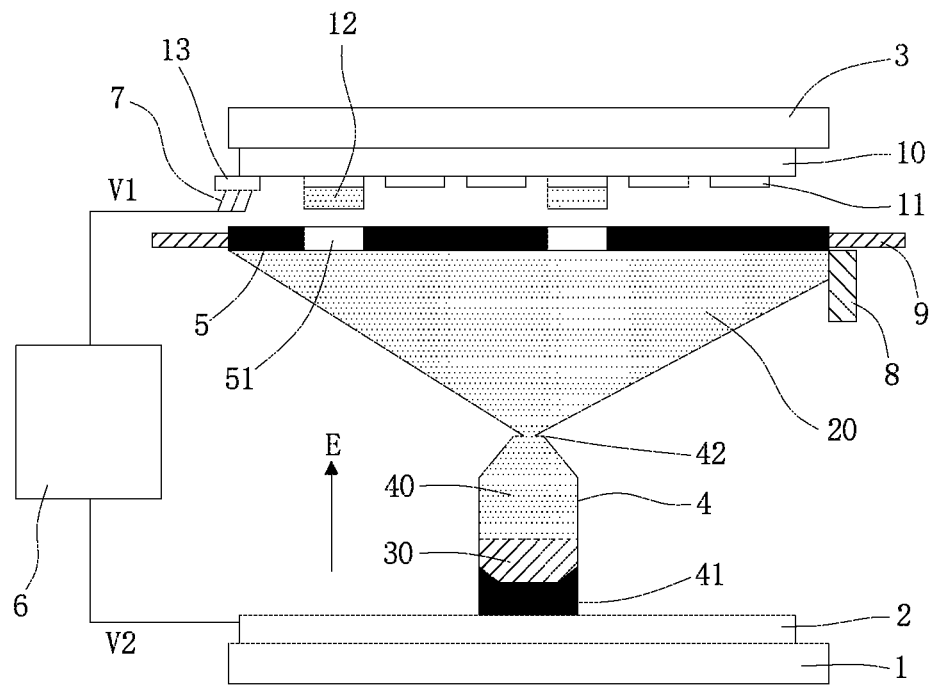
FIG. 1 is a schematic view showing the structure of the evaporation deposition equipment according to an embodiment of the present invention.

Referring to FIG. 1, the present invention provides an evaporation deposition equipment, comprising: a first platform 1, a second platform 3, a vaporizing unit 4, a mask carrier 9 and an electric field forming unit 6, the evaporation deposition equipment is for vapor-depositing an organic light-emitting layer 12 on an array substrate 10 with a formed anode layer 11, wherein the array substrate 10 is used as an array substrate of an OLED panel, and the array substrate 10 is disposed with a pixel circuit (not shown) and a signal input end 13; the anode layer 11 array is formed on the array substrate 10, and the anode layer 11 is electrically connected to the pixel circuit. In the evaporation deposition equipment, the first platform 1, the second platform 3, the vaporizing unit 4, and the mask carrier 9 are usually disposed inside a vacuum chamber (now shown), and the electric field forming unit 6 may also be disposed inside the vacuum chamber, or outside of the vacuum chamber.

Wherein the first platform 1 and the second platform 3 are oppositely disposed, and the first platform 1 is disposed with an electrode plate 2. The second platform 3 is disposed above the first platform 1, for carrying the array substrate 10. The vaporizing unit 4 is disposed at the electrode plate 2, for generating charged vapor-depositing material particles 20 and spraying the charged vapor-depositing material particles 20 towards the array substrate 10. The mask carrier 9 is for fixing a mask 5 with opening pattern 51 between the array substrate 10 and the vaporizing unit 4. The electric field forming unit 6 is electrically connected to the array substrate 10 and the electrode plate 2, for forming an electric field E between the anode layer 11 and the electrode plate 2, the electric field E guides the charged vapor-depositing material particles 20 along a direction perpendicular to the array substrate towards the array substrate 10. The charged vapor-depositing material particles 20 pass through the opening pattern 51 and are deposited on the array substrate 10 to form an organic light-emitting layer 12 corresponding to the opening pattern 51 of the mask 5.

Specifically, as shown in FIG. 1, the vaporizing unit 4 comprises a crucible 41 and a nozzle 42, the nozzle 42 is open toward the second platform 3, and the crucible 41 is used for heating a vapor-depositing material 30 to vaporize the vapor-depositing material 30 to form vapor-depositing material particles 40, and the vapor-depositing material particles 40 are ejected from the nozzle 42 and rubbed against the nozzle 42 to form the charged vapor-depositing material particles 20. Wherein the vapor-depositing material 30 is an organic light-emitting material, and the specific selection depends on the organic light-emitting layer 12 to be formed.

Specifically, the nozzle 42 has an opening width of 5-15 mm, and the vapor-depositing material particles have a particle size of 0.1-1 nm. The vapor-depositing material particles 40 are ejected from the nozzle 42 and are frictionally charged with the nozzle 42. The principle can be referenced to the Millikan oil-drop experiment. Specifically, the specific size of the opening width of the nozzle 42 is set according to the specific particle size of the vapor-depositing material particles 40 formed by vaporization of the selected vapor-depositing material 30, so as to ensure that the vapor-depositing material particles 40 can interact with the nozzle 42 by friction to charge the vapor-depositing material particles 40.

Specifically, as shown in FIG. 1, the electric field forming unit 6 applies a first voltage V1 to the anode layer 11 through the array substrate 10, and the electric field forming unit 6 applies a second voltage V2 to the electrode plate 2, and the first voltage V1 and the second voltage V1 are not equal so that an electric field E is formed between the anode layer 11 and the electrode plate 2. Wherein the electric field forming unit 6 is electrically connected to the signal input end 13 through a probe 7, and then applies the first voltage V1 to the anode layer 11 through the pixel circuit.

Wherein when the specific vapor-depositing material 30 is selected and the corresponding vapor-depositing material particles 40 are rubbed against the nozzle 42, the polarity of the charged vapor-depositing material particles 20 may be positive or negative. For example, when a quinacridone organic material is selected as the vapor-depositing material 30, the dielectric constant thereof is high under a highly vacuum environment, and the particles of the material are positively charged by friction with the nozzle. When Tetra (t-butyl) perylene organic material is selected as the vapor-depositing material 30, charge polarity due to the friction between the particles of the material and the nozzle is negative. Therefore, the electric field forming unit 6 controls the magnitude relation between the first voltage V1 and the second voltage V2 according to the charged polarity of the charged vapor-depositing material particles 20 to adjust the direction of the electric field E to ensure that the electric field E directs the charged vapor-depositing material particles 20 to the array substrate 10.

Wherein the mask 5 is a metal mask, and the opening pattern 51 of the mask 5 is designed according to the pattern of the organic light-emitting layer 12 to be formed.

Moreover, in the present embodiment, as shown in FIG. 1, the evaporation deposition equipment further comprises a film thickness monitor unit 8 that obtains a film thickness of the organic light-emitting layer 12 by detecting a deposition rate of the charged vapor-depositing material particles 20.

In the evaporation deposition equipment provided by the embodiment of the present invention, an evaporation unit generates charged vapor-depositing material particles, and then during depositing the charged vapor-depositing material particles, the electric field forming unit applies an electric field to make the charged vapor-depositing material particles travel along a direction perpendicular to the array substrate to deposit. The travel of the charged vapor-depositing material particles is oriented, which can not only prevent the charged vapor-depositing material particles from being deposited outside the target area and reduce the color mixing problem on the OLED panel, but also reduce the loss of the vapor-depositing material particles due to non-directional diffusion deposition and improve the utilization rate of the vapor-depositing material to reduce the cost.

The present invention also provides an evaporation deposition method, for vapor-depositing an organic light-emitting layer on an array substrate with a formed anode layer. The following describes the process in collaboration with FIG. 1. The evaporation deposition method comprises:

S10: providing the aforementioned evaporation deposition equipment.

S20: fixing the array substrate 10 to the second platform 3.

S30: fixing the mask 5 with opening pattern 51 to the mask carrier 9, disposed between the array substrate 10 and the vaporizing unit 4.

S40: controlling the vaporizing unit 4 to generate charged vapor-depositing material particles 20 and spray the charged vapor-depositing material particles 20 towards the array substrate 10.

S50: controlling the electric field forming unit 6 to form an electric field E between the anode layer 11 and the electrode plate 2, the electric field E guiding the charged vapor-depositing material particles 20 towards the array substrate 10 to deposit to form an organic light-emitting layer 12 corresponding to the opening pattern 51 of the mask 5.

Wherein the evaporation deposition method further comprises: controlling a film thickness monitor unit 8 to obtain a film thickness of the organic light-emitting layer 12 in real-time by detecting a deposition rate of the charged vapor-depositing material particles 20.

Figure 2A:
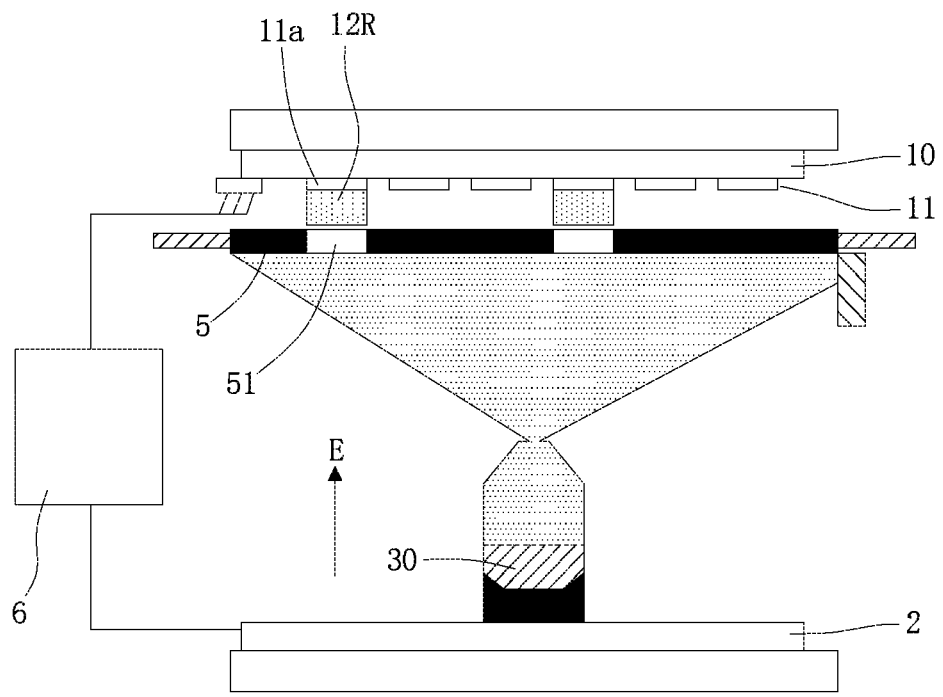
FIGS. 2a-2c are schematic views showing the structures corresponding to the steps of evaporation deposition method according to the embodiment of the present invention.
Figure 2B:
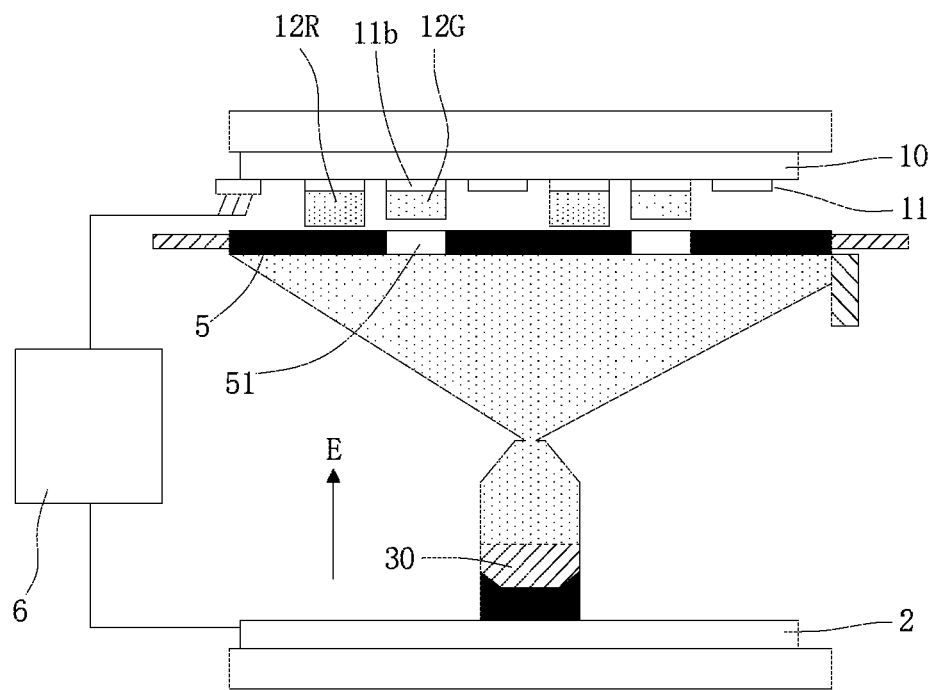
Figure 2C:
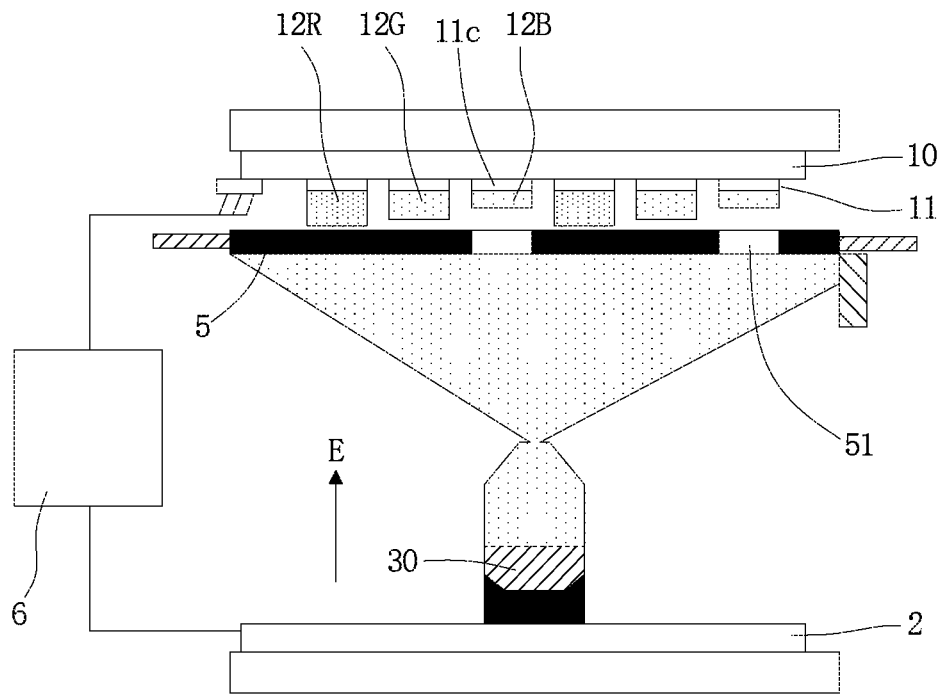

Wherein, referring to FIGS. 2a-2c, the anode layer 11 of the array substrate 10 comprises a first anode layer 11a corresponding to red sub-pixels, a second anode layer 11b corresponding to green sub-pixels, and a third anode layer 11c corresponding to blue sub-pixels. The organic light-emitting layer 12 comprises: a red organic light-emitting layer 12R disposed on the first anode layer 11a, a green organic light-emitting layer 12G disposed on the second anode layer 11b, and a blue organic light-emitting layer 12B disposed on the third anode layer 11c, The red organic light-emitting layer 12R, the green organic light-emitting layer 12G, and the blue organic light-emitting layer 12B are sequentially formed by the above evaporation deposition method.

Wherein, as shown in FIG. 2a, when depositing the red organic light emitting layer 12R, an organic light emitting material capable of generating red light is selected as the vapor-depositing material 30, and the opening pattern 51 of the mask 5 is selected to form a pattern corresponding to the red organic light-emitting layer 12R. The opening pattern 51 of the mask plate 5 faces the first anode layer 11a. Because the red organic light-emitting layer 12R is formed on the first anode layer 11a, when the electric field forming unit 6 applies the first voltage to the anode layer 11, the electric field forming unit 6 may apply the first voltage to the first anode layer 11a only so that the electric field E is formed only between the first anode layer 11a and the electrode plate 2, and hence, the organic light-emitting material that generates red light is deposited only on the first anode layer 11a to form the red organic light-emitting layer 12R.

Wherein, as shown in FIG. 2b, after deposition to form the red organic light-emitting layer 12R, the green organic light-emitting layer 12G is deposited. At this point, an organic light emitting material capable of generating green light is selected as the vapor-depositing material 30, and the opening pattern 51 of the mask 5 is selected to form a pattern corresponding to the green organic light-emitting layer 12G. The opening pattern 51 of the mask plate 5 faces the second anode layer 11b. Because the green organic light-emitting layer 12G is formed on the second anode layer 11b, when the electric field forming unit 6 applies the first voltage to the anode layer 11, the electric field forming unit 6 may apply the first voltage to the second anode layer 11b only so that the electric field E is formed only between the second anode layer 11b and the electrode plate 2, and hence, the organic light-emitting material that generates green light is deposited only on the second anode layer 11b to form the green organic light-emitting layer 12G.

Wherein, as shown in FIG. 2c, after deposition to form the green organic light-emitting layer 12G, the blue organic light-emitting layer 12B is deposited, At this point, an organic light emitting material capable of generating blue light is selected as the vapor-depositing material 30, and the opening pattern 51 of the mask 5 is selected to form a pattern corresponding to the blue organic light-emitting layer 12B. The opening pattern 51 of the mask plate 5 faces the third anode layer 11c, Because the blue organic light-emitting layer 12B is formed on the third anode layer 11c, when the electric field forming unit 6 applies the first voltage to the anode layer 11, the electric field forming unit 6 may apply the first voltage to the third anode layer 11c only so that the electric field E is formed only between the third anode layer 11c and the electrode plate 2, and hence, the organic light-emitting material that generates blue light is deposited only on the third anode layer 11b to form the blue organic light-emitting layer 12B.

In the evaporation deposition method provided by the embodiment of the present invention, charged vapor-depositing material particles are generated, and then during depositing the charged vapor-depositing material particles, an electric field is applied to make the charged vapor-depositing material particles travel along a direction perpendicular to the array substrate to deposit. The travel of the charged vapor-depositing material particles is oriented, which can not only prevent the charged vapor-depositing material particles from being deposited outside the target area and reduce the color mixing problem on the OLED panel, but also reduce the loss of the vapor-depositing material particles due to non-directional diffusion deposition and improve the utilization rate of the vapor-depositing material to reduce the cost.

In summary, the evaporation deposition equipment and method provided by the embodiments of the present invention can be applied to form organic light-emitting layer by evaporation deposition on the array substrate, able to prevent the charged vapor-depositing material particles from being deposited outside the target area and reduce the color mixing problem on the OLED panel.

It will be apparent to those skilled in the art that the invention is not limited to the details of the foregoing exemplary embodiments, but that the present invention may be embodied in other specific forms without departing from the spirit or essential characteristics of the invention. Thus, the present examples are to be considered in all respects as illustrative and not restrictive, the scope of the invention being indicated by the appended claims rather than by the foregoing description, and thus is intended to be included in the claims. All changes which come within the meaning and range of equivalency of the appended claims are intended to be embraced therein. Any reference signs in the claims should not be construed as limiting the claim involved.

In addition, it should be understood that although the specification is described according to the embodiments, not every embodiment includes only one independent technical solution. This description of the specification is merely for the sake of clarity and the person skilled in the art should consider the specification as a whole, the technical solutions in the embodiments may also be combined as appropriate to form other embodiments that can be understood by those skilled in the art.

What is claimed is:

1. An evaporation deposition equipment, applicable to vapor-depositing an organic light-emitting layer on an array substrate with a formed anode layer, the evaporation deposition equipment comprising:
   a first platform, disposed with an electrode plate;
   a second platform, disposed above the first platform, for carrying the array substrate;
   a vaporizing unit, disposed at the electrode plate, for generating charged vapor-depositing material particles and spraying the charged vapor-depositing material particles towards the array substrate;
   a mask carrier, for fixing a mask with opening pattern between the array substrate and the vaporizing unit;
   an electric field forming unit, electrically connected to the array substrate and the electrode plate, for forming an electric field between the anode layer and the electrode plate, the electric field guiding the charged vapor-depositing material particles towards the array substrate to deposit to form an organic light-emitting layer corresponding to the opening pattern of the mask;
   wherein the electric field forming unit applies a first voltage to the anode layer through the array substrate, and the electric field forming unit applies a second voltage to the electrode plate, and the first voltage and the second voltage are not equal so that an electric field is formed between the anode layer and the electrode plate;
   wherein the electric field forming unit controls magnitude relationship between the first voltage and the second voltage according to charged polarity of the charged vapor-depositing material particles to adjust direction of the electric field;
   wherein, when the charged vapor-depositing material particles has a positive polarity, the electric field forming unit controls the second voltage to be greater than the first voltage;
   when the charged vapor-depositing material particles has a negative polarity, the electric field forming unit controls the second voltage to be less than the first voltage.

2. The evaporation deposition equipment as claimed in claim 1, wherein the vaporizing unit comprises a crucible and a nozzle, the nozzle is open toward the second platform, and the crucible is used for heating a vapor-depositing material to vaporize the vapor-depositing material to form vapor-depositing material particles, and the vapor-depositing material particles are ejected from the nozzle and rubbed against the nozzle to form the charged vapor-depositing material particles.

3. The evaporation deposition equipment as claimed in claim 2, wherein the nozzle has an opening width of 5-15 mm, and the vapor-depositing material particles have a particle size of 0.1-1 nm.

4. The evaporation deposition equipment as claimed in claim 1, wherein the array substrate is disposed with a pixel circuit and a signal input end, the anode layer is electrically connected to the pixel circuit, the electric field forming unit is electrically connected to the signal input end through a probe, and then applies the first voltage to the anode layer through the pixel circuit.

5. The evaporation deposition equipment as claimed in claim 1, further comprising:
a film thickness monitor unit for obtaining a film thickness of the organic light-emitting layer by detecting a deposition rate of the charged vapor-depositing material particles.

6. An evaporation deposition method, applicable to vapor-depositing an organic light-emitting layer on an array substrate with a formed anode layer, the evaporation deposition method comprising:
S10: providing an evaporation deposition equipment, evaporation deposition equipment comprising:
a first platform, disposed with an electrode plate;
a second platform, disposed above the first platform, for carrying the array substrate;
a vaporizing unit, disposed at the electrode plate;
a mask carrier, for fixing a mask with opening pattern between the array substrate and the vaporizing unit;
an electric field forming unit, electrically connected to the array substrate and the electrode plate, for forming an electric field between the anode layer and the electrode plate;
S20: fixing the array substrate to the second platform;
S30: fixing the mask with opening pattern to the mask carrier, disposed between the array substrate and the vaporizing unit;
S40: controlling the vaporizing unit to generate charged vapor-depositing material particles and spray the charged vapor-depositing material particles towards the array substrate;
S50: controlling the electric field forming unit to form an electric field between the anode layer and the electrode plate, the electric field guiding the charged vapor-depositing material particles towards the array substrate to deposit to form an organic light-emitting layer corresponding to the opening pattern of the mask;
wherein the organic light-emitting layer comprises: a red organic light-emitting layer disposed on a first anode layer, a green organic light-emitting layer disposed on a second anode layer, and a blue organic light-emitting layer disposed on a third anode layer; wherein:
when depositing the red organic light-emitting layer, the opening pattern of the mask faces the first anode layer, and the electric field unit forms the electric field only between the first anode layer and the electrode plate;
when depositing the green organic light-emitting layer, the opening pattern of the mask faces the second anode layer, and the electric field unit forms the electric field only between the second anode layer and the electrode plate;
when depositing the blue organic light-emitting layer, the opening pattern of the mask faces the third anode layer, and the electric field unit forms the electric field only between the third anode layer and the electrode plate.

7. The evaporation deposition method as claimed in claim 6, wherein the evaporation deposition equipment further comprises a film thickness monitor unit for obtaining a film thickness of the organic light-emitting layer by detecting a deposition rate of the charged vapor-depositing material particles;
the evaporation deposition method further comprises:
obtaining a film thickness of the organic light-emitting layer in real-time by detecting a deposition rate of the charged vapor-depositing material particles.

8. The evaporation deposition method as claimed in claim 6, wherein the vaporizing unit comprises a crucible and a nozzle, the nozzle is open toward the second platform, and the crucible is used for heating a vapor-depositing material to vaporize the vapor-depositing material to form vapor-depositing material particles, and the vapor-depositing material particles are ejected from the nozzle and rubbed against the nozzle to form the charged vapor-depositing material particles.

9. The evaporation deposition method as claimed in claim 6, wherein the nozzle has an opening width of 5-15 mm, and the vapor-depositing material particles have a particle size of 0.1-1 nm.

10. The evaporation deposition method as claimed in claim 6, wherein the electric field forming unit applies a first voltage to the anode layer through the array substrate, and the electric field forming unit applies a second voltage to the electrode plate, and the first voltage and the second voltage are not equal so that an electric field is formed between the anode layer and the electrode plate.

11. The evaporation deposition method as claimed in claim 10, wherein the electric field forming unit controls magnitude relationship between the first voltage and the second voltage according to charged polarity of the charged vapor-depositing material particles to adjust direction of the electric field;
wherein, when the charged vapor-depositing material particles has a positive polarity, the electric field forming unit controls the second voltage to be greater than the first voltage;
when the charged vapor-depositing material particles has a negative polarity, the electric field forming unit controls the second voltage to be less than the first voltage.

12. The evaporation deposition method as claimed in claim 10, wherein the array substrate is disposed with a pixel circuit and a signal input end, the anode layer is electrically connected to the pixel circuit, the electric field forming unit is electrically connected to the signal input end through a probe, and then applies the first voltage to the anode layer through the pixel circuit.

* * * * *